United States Patent [19]
Neuharth et al.

[11] Patent Number: 5,347,236
[45] Date of Patent: Sep. 13, 1994

[54] MODULATOR FOR NEGATIVE PULSE ACTIVATED OSCILLATORS

[75] Inventors: Steven D. Neuharth, Glendale; James Lobsinger, Peoria; Dean J. Janke, Phoenix, all of Ariz.

[73] Assignee: Honeywell Inc., Minneapolis, Minn.

[21] Appl. No.: 83,956

[22] Filed: Jun. 25, 1993

[51] Int. Cl.⁵ .............................. H03B 9/10
[52] U.S. Cl. ...................... 331/87; 315/5.13
[58] Field of Search ............... 331/5, 86, 87, 88, 90; 315/5.13

[56] References Cited

U.S. PATENT DOCUMENTS 4,620,078 10/1986 Smith .................. 331/87 X

Primary Examiner—David Mis
Attorney, Agent, or Firm—Seymour Levine; Dale E. Jepsen; Albin Medved

[57] ABSTRACT

A modulator for providing modulating voltages across the anode and cathode of a negatively pulsed magnetron includes a switch which, when activated, couples the modulating voltage source to the cathode terminal, a current regulator which maintains a constant current flow through the anode and cathode when the modulating voltage is applied, and a voltage control circuit that reduces an excessive time rate of voltage change across the switch caused by arcing across the anode-cathode gap. A filament power supply is provided which supplies filament current while isolating the modulating voltage at the cathode from high voltage sensitive components in the filament power supply.

13 Claims, 4 Drawing Sheets

MODULATOR FOR NEGATIVE PULSE ACTIVATED OSCILLATORS

BACKGROUND OF THE INVENTION

1. Field of the Invention

The invention relates to the field of magnetron modulation and more particularly to modulators for use with magnetrons requiring negative pulses for activation.

2. Description of the Prior Art

A weather radar determines turbulence in a given region from the signal level and doppler shift of the signal returns. These parameters are representative of the reflectivity and velocity of the air mass in the illuminated region. The reflectivity, which is a measure of the air density, and the velocity are then processed to establish the turbulence in the region. Since a variation of frequency and/or amplitude from pulse-to-pulse can give rise to erroneous data, transmitters which provide signals with amplitudes and frequencies that do not vary from pulse-to-pulse are required. Additionally, frequency and amplitude stability are required for ground and sea clutter rejection.

Due to the requirement that sufficient warning be given of turbulence in a region, it is desirable to use a magnetron, with its high power output, as the transmitting device. The transmitted signal frequency and amplitude are functions of the current that flows through the magnetron during the transmission period. Consequently, to provide pulse-to-pulse frequency and amplitude stability the current must be tightly regulated. In the prior art pulse-to-pulse stability is generally provided by regulating the voltage amplitude of the pulse modulating the magnetron, thereby indirectly regulating the current. Since small variations in the applied voltage cause large variations in the current through the magnetron, the control of the pulse amplitude requires extremely tight voltage regulation which is difficult to achieve.

A system of the prior art which directly regulates the magnetron current is disclosed in U.S. Pat. 4,835,536, entitled "Weather Radar With Turbulence Detection" issued on May 30, 1989 to G. H. Piesinger and S. D. Neuharth and assigned to the assignee of the present invention. This system employs a positive pulse magnetron, that is the magnetron is fired by applying a positive pulse to its anode. The lifetime of such magnetrons is relatively short, being in the order of 500 hours of use. It is therefore desirable to replace the positive pulse magnetrons with the small negatively pulsed magnetrons having lifetimes in the order of 2000 hours which have recently become available. These negatively pulsed magnetrons are fired by applying a negative pulse to its cathode. A negative pulse magnetron, like the positive pulse magnetron, requires current stabilization to achieve pulse-to-pulse stability. Since the magnetron filament is coupled to the cathode in a negative pulse magnetron, another problem presented is the isolation of the d.c. filament power supply from the high negative voltage applied to the cathode.

Magnetrons may arc when fired. Though such arcing occurs only on a small percentage of the firings, when the arcing does occur damage to modulator switch which controls the pulsing of the magnetron results. Since the reliability of the system is a function of the reliability of all the system elements, it is desirable to provide circuitry that protects the switch.

SUMMARY OF THE INVENTION

In accordance with the principles of the present invention a modulator for modulating an oscillator, as for example a magnetron, for which modulation is accomplished by applying a modulating voltage between an anode and a cathode includes a switch, and a voltage source. The switch when activated and deactivated couples and decouples the voltage source to the cathode terminal. The anode terminal is permanently coupled to voltage source. The modulator further includes a current regulator serially coupled to the switch, anode and cathode to maintain the current through the anode and cathode at a constant level during the time period that voltage source is coupled to the cathode. Rapid voltage changes across the switch caused by arching across the anode-cathode gap, which may damage the switch, are suppressed by a circuit coupled in series with the switch, anode, and cathode. Current to a magnetron filament, which is coupled to the cathode, is provided by a switching power supply electrically isolated from the cathode by a transformer-rectifier-filter circuit coupled between the cathode-filament combination and the switching power supply.

DESCRIPTION OF THE PREFERRED EMBODIMENT

Figure 1:
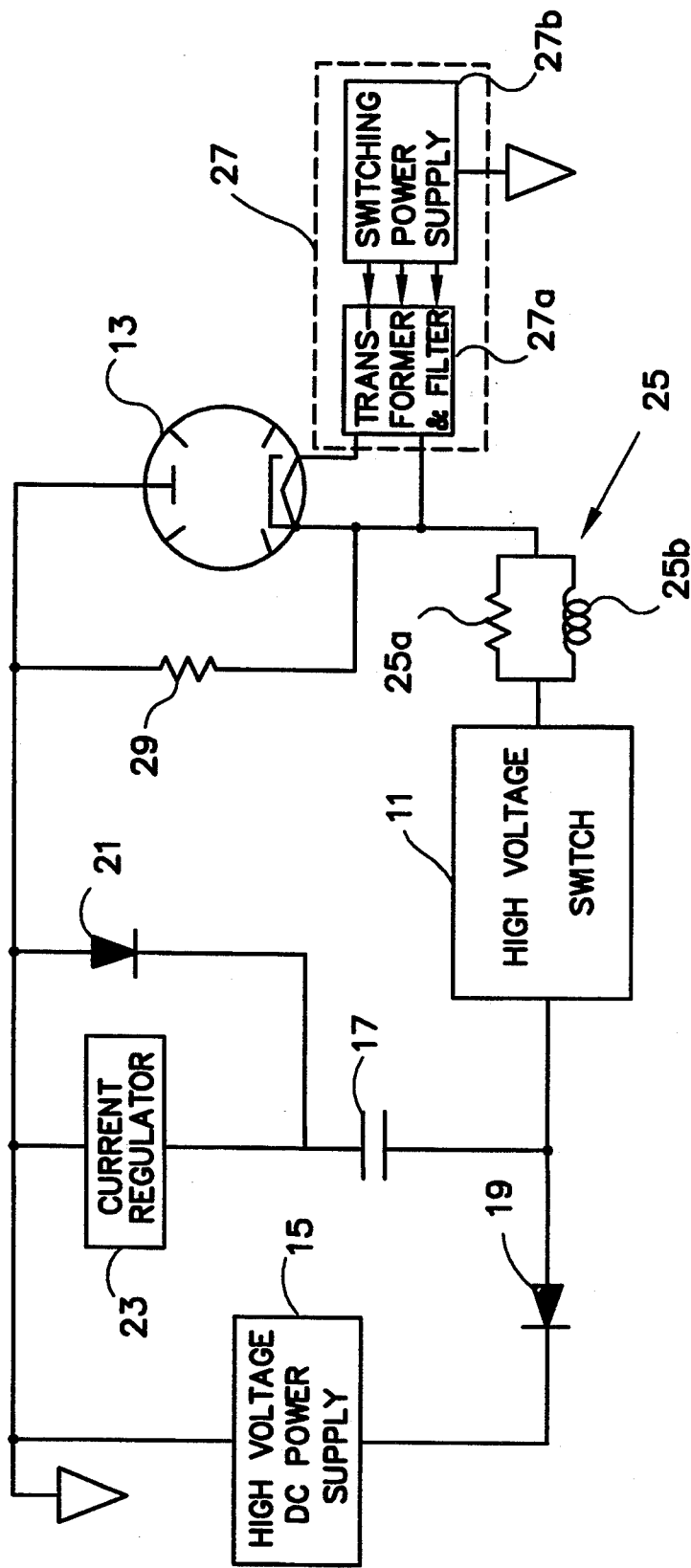
FIG. 1 is a block diagram of a preferred embodiment of the invention.

Refer now to the block diagram of a preferred embodiment shown in FIG. 1. With high voltage switch 11 open so that current can not flow through the magnetron 13, High voltage power supply 15 charges storage capacitor 17 to a predetermined voltage level through diodes 19 and 21, bypassing current regulator 23. After the capacitor 17 is charged, high voltage switch 11 is activated and thereby discharging the capacitor 17 is discharged through the anode and cathode of magnetron 13. When the high voltage switch 11 is closed, diode 21 is reversed biased and the high voltage power supply 15 is shut off, creating an open circuit along the path of the high voltage power supply 15 and diode 19. At this time a closed circuit is established along the path of the magnetron 13, current regulator 23, capacitor 17, high voltage switch 11, and a voltage controller circuit 25.

Oscillation frequency of a magnetron is a function of the current flowing through the magnetron anode and cathode. To maintain a constant frequency the current through the tube must be held constant. This constant current is established by the current regulator 23. As the capacitor 17 discharges to provide the current through the magnetron 13, the voltage across the capacitor 17, and concomitant voltage applied to the magnetron, droops causing the current through the magnetron to vary. To eliminate this current variation the voltage level to which the capacitor is charged is greater than the voltage required to establish the current through the magnetron for the desired oscillation frequency. The regulation of current through the current regulator 23 establishes a voltage drop across the current regulator 23 which is the difference between the instantaneous voltage across the capacitor and the voltage required for magnetron current flow for the desired magnetron oscillation frequency.

Arcing occurs in a magnetron (that is arcing across the anode-cathode gap) for a small percentage of magnetron firings. When arcing does occur, however, a very rapid time rate of change of voltage is experienced in the circuit. Such high rates of voltage change may cause elements in the high voltage switch 11 to fail. To eliminate the high time rate of voltage change, a circuit 25, including a resistor 25a and an inductor 25b, may be provided between the magnetron 13 and the switch 11. This circuit, interacting with elements of the switch, provides sufficient high frequency attenuation for the reduction of the time rate of change of the voltage across the switch 11.

In a magnetron, as in many tubes, the filament and the cathode are coupled. In negative pulse magnetrons, this coupling establishes a high negative voltage at the filament when the magnetron is fired, which must be isolated from the filament power supply 27. To accomplish this isolation, the filament power supply includes a transformer-filter circuit 27a and a switching power supply 27b, which is isolated from the cathode of the magnetron 13 by the transformer action of the transformer-filter circuit 27a.

Parasitic capacitance in the magnetron 13 is charged during the magnetron pulse period. These capacitor charges are discharged during the fall of the magnetron voltage and as a result thereof, may extend the fall time of the magnetron voltage. It is therefore necessary to decrease the magnetron voltage as rapidly as possible. To accomplish this rapid magnetron voltage decrease, a pull down resistor 29 is coupled across the magnetron 13 through which the parasitic capacitance is discharged after each firing.

Figure 2:
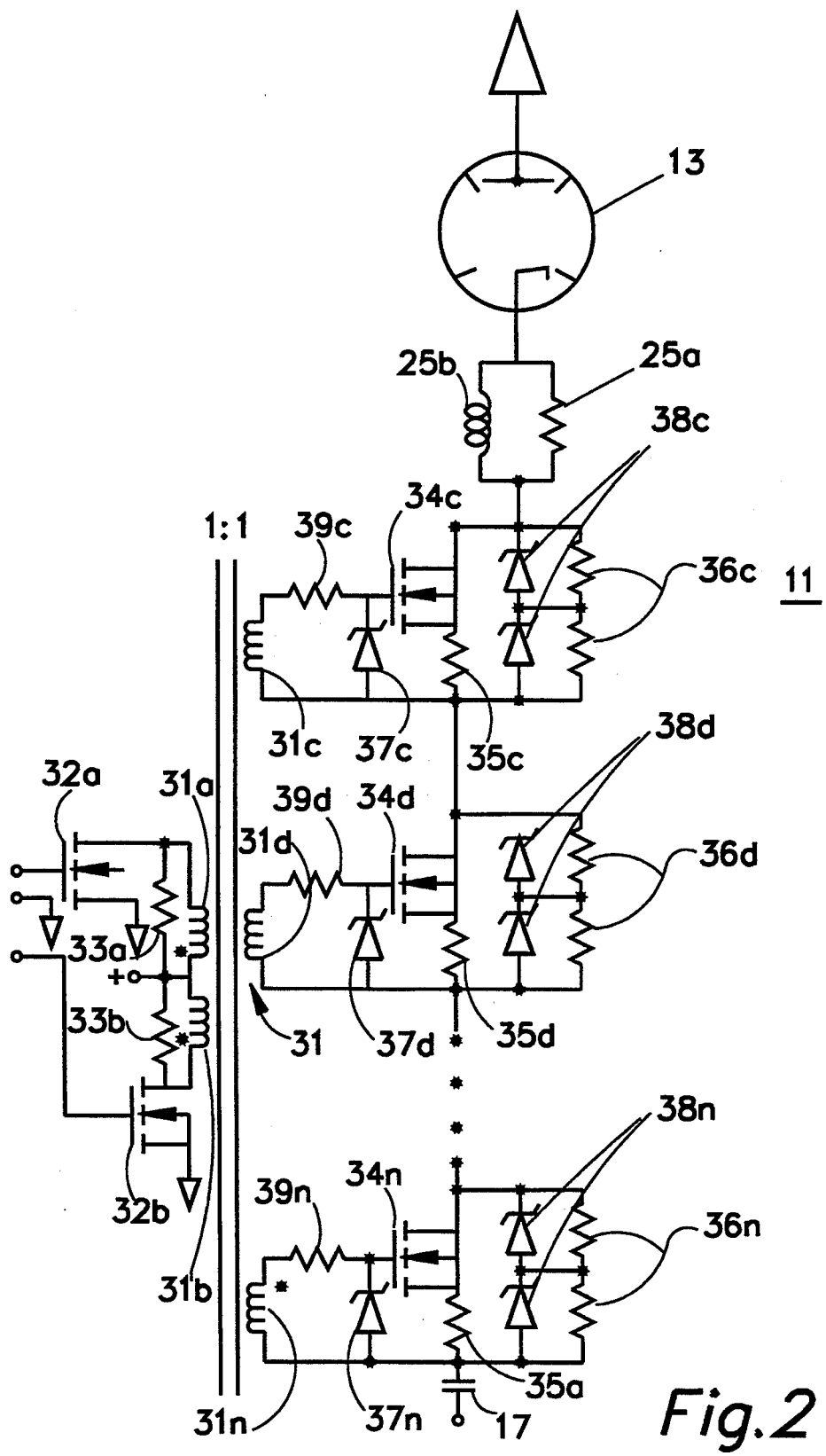
FIG. 2 is schematic diagram of a switch that may be used as the high voltage switch in the preferred embodiment.

A schematic diagram of a switch that may be employed as the high power switch 11 is shown in FIG. 2. Throughout the discussion herein, similar elements in all figures have the same reference numerals. Activation signals for the high power switch are coupled to a push pull drive comprising a transformer 31 with a center tapped primary winding having a first half 31a and a second half 31b, first and second MOSFETs 32a and 32b are respectively coupled to the first and second halves of the primary winding. A plurality of secondary windings 31c–31n are respectively coupled between the gate and source terminals of a plurality of MOSFETs 34c–34n. Resistors 35c–35n may be respectively coupled between a terminal of each of the secondary windings 31c–31n and the source terminal of each of the MOSFETs 34c–34n. Resistors 36c–36n divide dc voltage from a dc voltage source, not shown, between the MOSFETs to provide the required drain-to-source voltage. Zener diodes 37c–37n and 38c–38 n, respectively, protect the gate oxide of each MOSFET from breakdown and maintain the drain-to-source voltage below a predetermined voltage level.

An activation signal trigger coupled from the control unit, not shown, to the first MOSFET 32a causes it to conduct thereby completing the circuit through the first half 31a of the center tapped primary. The voltage generated in the secondary in response to the trigger voltage applied to the gates of the MOSFETs 34c–34n causes current to flow through the MOSFETs, thereby closing the switch and coupling the charged storage capacitor 17 to the magnetron 13 causing it to fire, as previously described. Resistors 35c–35n, which may be respectively coupled to the source of each of the MOSFETs limit the peak current through the magnetron. These resistors in conjunction with an inductor, such as inductor 25b, shown in FIG. 1, may also be utilized as part of a low pass filter for reducing the time rate of voltage change across the high voltage switch should the magnetron arc. After the time interval for the desired pulse width has elapsed, the control unit removes the trigger pulse from MOSFET 32a and couples a second trigger pulse to the second MOSFET 32b, causing it to conduct, thereby coupling a voltage to the secondary of the transformer of opposite polarity to that of the secondary voltage generated in response to the first trigger pulse. The voltage coupled to the gates of MOSFETs 35c–35n in response to the second trigger cuts off these MOSFETs and the high power switch is opened, preventing the further flow of current through the magnetron. After the magnetron pulse is completed, both MOSFETs 32a and 32b are cutoff awaiting trigger pulses from the control unit for the subsequent pulse.

The volt-seconds across the transformer due to the coupling of the second trigger to the winding 31b are of opposite polarity to the volt-seconds across the transformer due to the coupling of the first trigger pulse to the winding 31a. Since the second trigger pulse is always shorter than the first trigger pulse, there remains a net flux in the core after the termination of the two pulses. This residue flux causes the voltage at the undotted terminals of the transformer 31 to increase with respect to the dotted terminals. Consequently, at the termination of the two trigger pulses, current flows through winding 31a and resistor 33a; winding 31b and resistor 33b; windings 31c–31n; diodes 37c–37n; and resistors 39c–39n until the volt-seconds across the transformer are balanced and the net flux equals zero. In this manner the transformer is reset and the saturation of the core is prevented.

Figure 3:
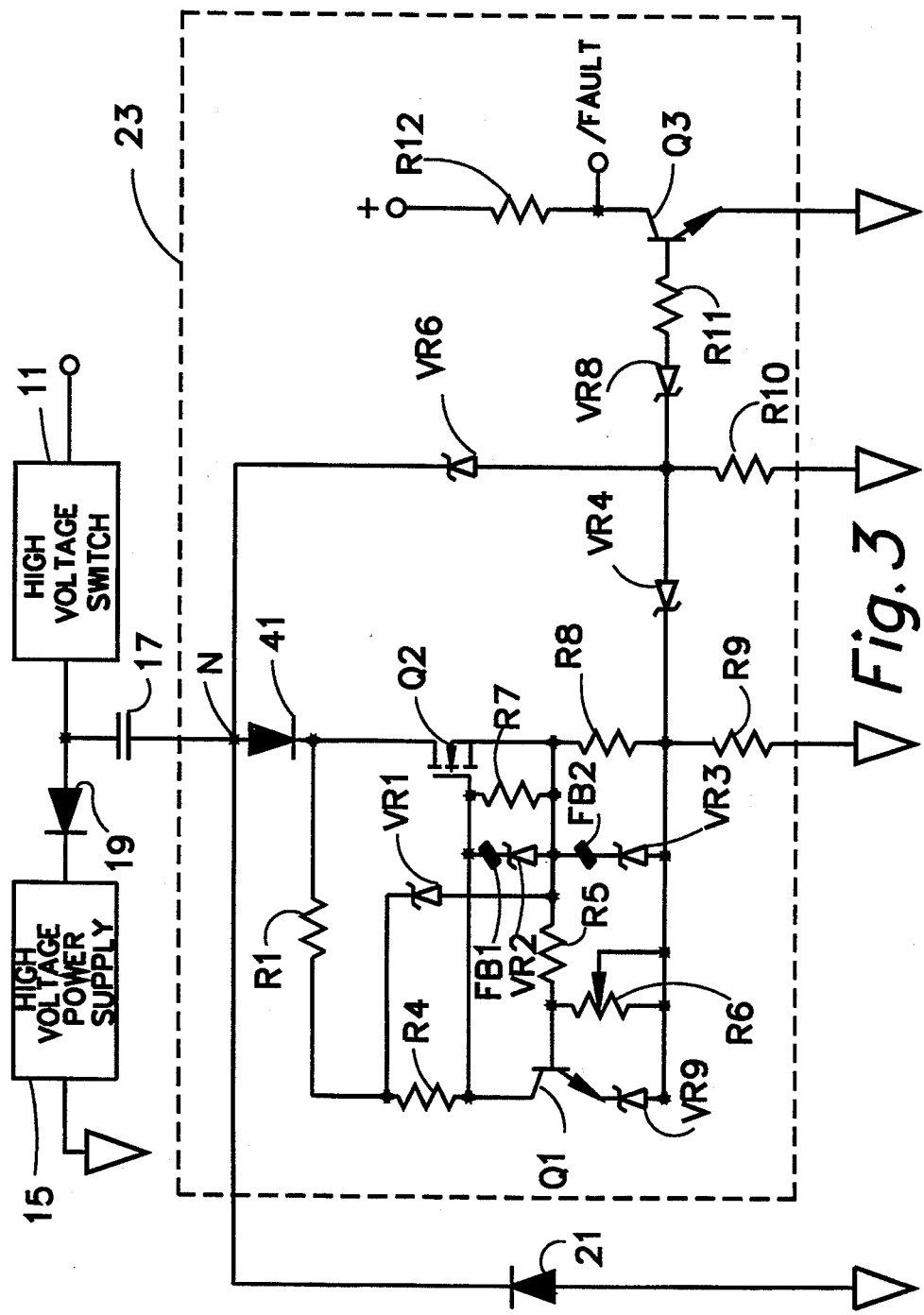
FIG. 3 is a schematic diagram of a current regulator that may be used as the current regulator in the preferred embodiment.

Refer now to FIG. 3 and refer again to FIG. 1. In FIG. 3 a schematic diagram of a current regulator that may be employed as the current regulator 23 is shown. As previously explained, when the capacitor 17 is charging, diodes 19 and 21 are forward biased so that current flows around the current regulator 23. Further isolation of the current regulator 23 during the charging period is provided by a third diode 41 which is biased in its non-conducting state while the capacitor 17 is charging. When the switch 11 is activated, diode 21 becomes reverse biased and diode 41 becomes forward biased. At the time the switch 11 closes, the voltage across MOSFET Q2 causes it to turn on, thereby permitting current to flow through the current sensing resistors R8 and R9. Turn on of Q2 is sharpened by the inclusion of R7 in the gate circuit. Breakdown of the gate of Q2 is prevented by VR2, which limits the voltage applied to the gate. Since ringing of the capacitance of VR2 with stray inductances may occur, a ferrite bead FB1 is coupled in series with VR1. The voltage drop across resistors R8 and R9, MOSFET Q2, and diode 41 reduces the voltage applied to the magnetron 13, by the discharge of the capacitor 17, to a level that causes the magnetron current to be at the level required for the desired oscillation frequency. As will be explained, the voltage across the regulator is varied in accordance with the voltage provided by the capacitor 17 in a manner to maintain a constant magnetron current. This regulator 23 voltage variation compensates for the voltage droop during the capacitor 17 discharge.

When current for the desired magnetron operating frequency flows through the resistor R8, the transistor Q1 turns on. To provide regulation of a variety magnetron operating currents, resistors R5 and R6 in the gate circuit of Q1 are variable and set for Q1 turn on in accordance with the desired operating current. The turn on of transistor Q1 maintains the voltage at the gate of MOSFET Q2, at the level required for MOSFET Q2 to conduct the desired operating current. Should the current flowing through MOSFET Q2 drop below the level required for the desired magnetron operation, the voltage drop across resistors R5 and R6 cause transistor Q1 to conduct less current, thereby raising the voltage at the gate of MOSFET Q2, thus causing MOSFET Q2 to conduct more current. In this manner the current flowing through the magnetron 13 is maintained at the level required for oscillation at the desired frequency.

Reference zener diode VR9, because of its zener impedance, requires constant bias current in order to provide a constant reference voltage. Constant current is maintained in the reference zener diode VR9 by the regulation action of zener diode VR1. The voltage at the cathode of zener diode VR1 remains constant as long as the voltage at the drain of MOSFET Q2 is greater than the breakdown voltage of zener diode VR1. Assuming negligible base current in transistor Q1, the bias current in zener diode VR9 is equal to the breakdown voltage of zener diode VR1 minus the gate-to-source voltage at MOSFET Q2 divided by the resistance of resistor R4, which is constant.

Should an arc occur in the magnetron, the increased current due thereto causes the voltage at the node N to exceed the breakdown voltage of Zener diodes VR6 and VR8, thereby causing Q3 to turn on and provide a fault signal at its collector. This fault signal is coupled to fault circuitry which then terminates the magnetron pulse. During such a period of high current the transistor Q1 is protected by VR3 which diverts current from Q1, thereby limiting the current that flows therethrough. Additional fault protection is provided by resistor R9. Should the MOSFET Q2 fail shorted and the magnetron arcs, the voltage developed across R9 will cause VR4 and VR8 to breakdown and turn Q3 on to provide the fault signal. False alarms in the fault circuitry due to noise are reduced by the circuit including VR8, R11, R10, and R13. This circuit prevents Q3 turn on for noise voltages developed across R10 that do not exceed the breakdown voltage of VR8.

Figure 4:
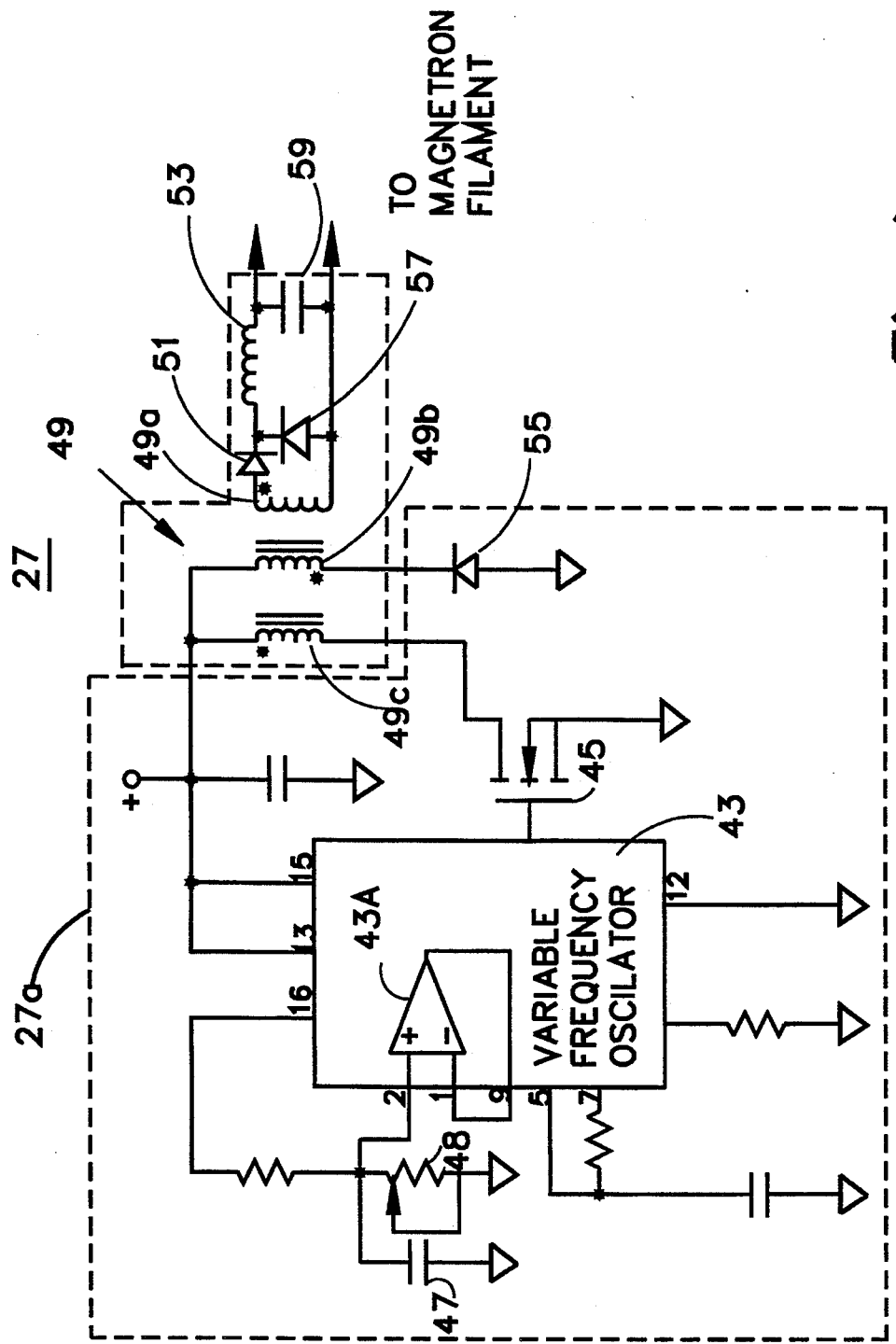
FIG. 4 is a schematic of a filament power supply that may be used as the filament power supply in the preferred embodiment.

Refer now to FIG. 4, wherein a schematic diagram of the filament power supply 27 is shown. The switching power supply 27a of the filament power supply 27 includes a variable duty cycle square wave oscillator 43 which drives the gate of a MOSFET 45. A reference voltage provided by a capacitor 47 and a variable resistor 48 is coupled to the non-inverting terminal of a difference amplifier 43a in the oscillator 43. The output terminal of the difference amplifier 43a to the inverting terminal. When the ramp voltage at the output terminal of the amplifier 43a exceeds the reference voltage, the output pulse of the oscillator is terminated for the remainder of the cycle. When the MOSFET 45 is turned on by a positive pulse provided by the oscillator 43 flows through a first primary winding 49c of transformer 49 causing all the terminals of the transformer that are dotted in the figure go positive a positive pulse at the winding 49a forward biases the diode 51 permitting current to flow through the filter inductance 53. At this time diode 55 is reversed biased and no current flows in a second primary winding 49b. When the pulse from the oscillator 43 terminates, the MOSFET 45 is turned off and the magnetizing flux in the core of the transformer 49 tends to drive the dotted terminals negative with respect to the undotted terminals. At this time the output diode is reversed biased. The magnetic flux in the inductor 53, however, causes the voltage at the cathode of diode 57 to drop, thereby forward biasing the diode. Thus the energy stored in the inductor 53 causes ac current to flow through capacitor 59 and dc current to flow in through the magnetron filament after the termination of the pulse. At the time the dotted terminal of winding 49b is driven negative, diode 55 is forward biased and current flows through the winding 49b, thereby resetting the magnetic flux in the core.

As stated above the pulse width of the pulses in the square wave provided by the oscillator 43 are functions of the reference voltage generated by the capacitor 47 and resistor 48 circuit. Since the output voltage of the filament power supply 27 is approximately equal to the input voltage to the transformer, times the turns ratio of the transformer, times the duty cycle, it should be apparent that the output voltage may be varied with adjustments of the resistor 48.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A modulator for modulating an oscillator having an anode, a cathode, and a filament, the modulator including a voltage source having a first terminal coupled to the anode and a second terminal, a switch having an on state and an off state, a first terminal of the switch coupled to the second terminal of the voltage source and a second terminal of the switch coupled to the cathode, the voltage source, switch, and oscillator arranged in a manner for current to flow between the anode and cathode when the switch is in the on state and for current not to flow between the anode and cathode when the switch is in the off state, the modulator further including a current regulator having first and second terminals respectively coupled to said first and second terminals of the voltage source for controlling current flow between the anode and cathode when the switch is in the on state, characterized in that the modulator further comprises a voltage controller coupled between said second terminal of said switch and said cathode, said voltage controller constructed and arranged to control time rate of change of voltage across said switch.

2. A modulator in accordance with claim 1 wherein said voltage controller comprises a resistor in parallel with an inductor.

3. A modulator in accordance with claim 1 wherein said voltage source includes a capacitor charged by a power supply, said capacitor having first and second terminals, said first terminal of said capacitor being said first terminal of said voltage source and said second terminal of said capacitor being said second terminal of said voltage source, said power supply having first and second terminals, said first terminal of said power supply coupled to said second terminal of said capacitor and said second terminal of said power supply being said second terminal of said voltage source and wherein said current regulator comprises:

means having a first and second terminals respectively coupled to said first and second terminals of said voltage source for maintaining current flow between said anode and said cathode at a predetermined current level;

means coupled to said maintaining means for detecting current flow at a selected current level greater than said predetermined current level; and means coupled to said detecting means for providing a fault signal when said selected current level is detected.

4. A modulator in accordance with claim 1 wherein said switch comprises:

at least one switch element having a first terminal coupled to said cathode and a second terminal coupled to said voltage source and a control terminal, said at least one switch element having a conducting state wherein current is permitted to flow between said first and second terminals and a non-conducting state wherein current is not permitted to flow between said first and second terminals, said at least one switch element set to said conducting state by a first pulse applied to said control terminal and to said non-conducting state in response to a second pulse applied to said control terminal subsequent to said first pulse;

a transformer having a first winding serially coupled to a second primary winding and at least one secondary winding respectively coupled to said control terminal of said at least one switch element;

an activator having a control terminal and first and second terminals serially coupled to said first primary winding, said activator providing an electrical conducting path between said first and second terminals thereof in response to an activating pulse applied to said control terminal thereof, said activating pulse causing said first pulse to be induced in said at least one secondary winding;

a deactivator having a control terminal and first and second terminals serially coupled to said second primary winding, said deactivator providing an electrical conducting path between said first and second terminals thereof in response to a deactivating pulse applied to said control terminal thereof, said deactivating pulse causing said second pulse to be induced in said at least one secondary winding.

5. A modulator in accordance with claim 1 wherein said oscillator is a negative pulse magnetron having a cathode, said cathode being said cathode of said oscillator, and a filament coupled to said cathode, said filament being said filament of said oscillator, and wherein said modulator further comprises a filament power supply coupled to said filament and constructed and arranged for providing current to said filament, while being electrically isolated from said cathode.

6. A modulator in accordance with claim 5 wherein said filament power supply comprises:

a switching power supply for providing switching pulses;

a transformer having input terminals coupled to said switching power supply, and output terminals; and a rectifier-filter circuit having input terminals coupled to said transformer output terminals and output terminals coupled to said filament.

7. A modulator in accordance with claim 6 wherein said transformer includes a first primary winding oppositely poled to a second primary winding and a secondary winding, terminals of said first primary being said input terminals and terminals of said secondary being said output terminals, and further including:

a switch, responsive to said switching pulses, having an on state and off state, serially coupled to said first primary winding to permit current flow through said primary winding when said switch is in said on state and not to permit current flow through said primary winding when said witch is said off state;

a diode serially coupled to said second primary winding in a manner to be reversed biased when a pulse from said switching power supply is coupled to said first and second primary windings and to be forward biased when said pulse terminates.

8. A modulator in accordance with claim 2 wherein said voltage source includes a capacitor charged by a power supply, said capacitor having first and second terminals, said first terminal of said capacitor being said first terminal of said voltage source and said second terminal of said capacitor being said second terminal of said voltage source, said power supply having a first terminal coupled to said second terminal of said capacitor and a second terminal that is said second terminal of said voltage source and wherein said current regulator comprises:

means having first and second terminals respectively coupled to said first and second terminals of said voltage source for maintaining current flow between said anode and said cathode at a predetermined current level;

means coupled to said maintaining means for detecting current flow at a selected current level greater than said predetermined current level; and means coupled to said detecting means for providing a fault signal when said selected current level is detected.

9. A modulator in accordance with claim 7 wherein said rectifier-filter includes a capacitor coupled to said output terminals of said rectifier-filter and wherein said rectifier filter is constructed and arranged so that a.c. current flows through said capacitor and d.c. current is provided to said filament when said switch is in said off state.

10. A modulator in accordance with claim 8 wherein said oscillator is a negative pulse magnetron having a cathode, said cathode being said cathode of said oscillator, and a filament coupled to said cathode, said filament being said filament of said oscillator and wherein said modulator further comprises a filament power supply coupled to said filament and constructed and arranged for providing current to said filament while being electrically isolated from said cathode.

11. A modulator in accordance with claim 10 wherein said filament power supply comprises:

a switching power supply for providing switching pulses;

a transformer having input terminals coupled to said switching power supply, and output terminals; and a rectifier-filter circuit having input terminals coupled to said transformer output terminals and output terminals coupled to said filament.

12. A modulator in accordance with claim 11 wherein said transformer includes a first primary winding oppositely poled to a second primary winding and a secondary winding, terminals of said first primary being said input terminals and terminals of said secondary being said output terminals, and further including:

switch, responsive to said switching pulses, having an on state and an off state, serially coupled to said first primary winding to permit current flow through said primary winding when said switch is in said on state and not to permit current flow through said primary winding when said switch is said off state;

a diode serially coupled to said second primary winding in a manner to be reversed biased when a pulse from said switching power supply is coupled to said first and second primary windings and to be forward biased when said pulse terminates.

13. A modulator in accordance with claim 12 wherein said rectifier-filter includes a capacitor coupled to said output terminals of said rectifier-filter and wherein said rectifier filter is constructed and arranged so that a.c. current flows through said capacitor and d.c. current is provided to said filament when said switch is in said off state.

* * * * *